United States Patent
Terasaki

(10) Patent No.: US 12,144,183 B2
(45) Date of Patent: Nov. 12, 2024

(54) ARITHMETIC OPERATION CIRCUIT AND NEUROMORPHIC DEVICE

(71) Applicant: TDK CORPORATION, Tokyo (JP)

(72) Inventor: Yukio Terasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 932 days.

(21) Appl. No.: 17/271,875

(22) PCT Filed: Feb. 27, 2020

(86) PCT No.: PCT/JP2020/007923
§ 371 (c)(1),
(2) Date: Feb. 26, 2021

(87) PCT Pub. No.: WO2021/171454
PCT Pub. Date: Sep. 2, 2021

(65) Prior Publication Data
US 2022/0130900 A1  Apr. 28, 2022

(51) Int. Cl.
| | |
|---|---|
| H10B 61/00 | (2023.01) |
| G06N 3/049 | (2023.01) |
| G06N 3/063 | (2023.01) |
| H10N 50/10 | (2023.01) |
| H10N 59/00 | (2023.01) |

(52) U.S. Cl.
CPC ............ *H10B 61/00* (2023.02); *G06N 3/049* (2013.01); *G06N 3/063* (2013.01); *H10N 50/10* (2023.02); *H10N 59/00* (2023.02)

(58) Field of Classification Search
CPC ........ H10B 61/00; G10N 59/00; H10N 50/10; G06N 3/049; G06N 3/063
USPC .......................................................... 706/15
See application file for complete search history.

(56) References Cited

U.S. PATENT DOCUMENTS

| | | | |
|---|---|---|---|
| 2015/0269483 A1 | 9/2015 | Nishitani et al. | |
| 2019/0171418 A1 | 6/2019 | Morie et al. | |
| 2020/0076045 A1* | 3/2020 | Seki ...................... | H04B 1/006 |

FOREIGN PATENT DOCUMENTS

| | | |
|---|---|---|
| JP | 2009-282782 A | 12/2009 |
| JP | 5160304 B2 | 3/2013 |
| JP | 2015-195011 A | 11/2015 |
| JP | 2018-508922 A | 3/2018 |

(Continued)

OTHER PUBLICATIONS

Chang, et al., "Building Neuromorphic Circuits with Memristive Devices", IEEE Circuits and Systems Magazine, 2nd Quarter 2013 (Year: 2013).*

(Continued)

*Primary Examiner* — Tsu-Chang Lee
(74) *Attorney, Agent, or Firm* — Oliff PLC

(57) ABSTRACT

An arithmetic operation circuit including: a variable resistance element that includes three terminals that are a first terminal, a second terminal, and a third terminal and is configured to be able to change a resistance value; a first electrode connected to the first terminal; a second electrode; a third electrode; a first switching element connected between the second electrode and the second terminal; a second switching element connected between the third electrode and the third terminal; and a capacitor connected between a transmission line connecting the second terminal and the first switching element and the ground.

13 Claims, 8 Drawing Sheets

(56) References Cited

FOREIGN PATENT DOCUMENTS

| JP | 2019-087704 A | 6/2019 |
|---|---|---|
| JP | 6591548 B2 | 10/2019 |
| WO | 2013/111200 A1 | 8/2013 |
| WO | 2016/113643 A1 | 7/2016 |
| WO | 2016/175770 A1 | 11/2016 |
| WO | 2018/034163 A1 | 2/2018 |
| WO | 2019/189895 A1 | 10/2019 |

OTHER PUBLICATIONS

Geoffrey W. Burr et al. "Neuromorphic Computing Using Non-Volatile Memory". Advances in Physics: X, 2017, vol. 2, No. 1, pp. 89-124.

P. Narayanan et al. "Toward On-Chip Acceleration of the Backpropagation Algorithm Using Nonvolatile Memory". IBM J. Res. Develop. vol. 61, No. 11, 2017.

Stefano Ambrogio et al. "Equivalent-Accuracy Accelerated Neural-Network Training Using Analogue Memory". Nature vol. 558, No. 60, 2018.

May 4, 2023 Office Action issued in Chinese Patent Application No. 202080005430.6.

* cited by examiner

ARITHMETIC OPERATION CIRCUIT AND NEUROMORPHIC DEVICE

TECHNICAL FIELD

The present invention relates to an arithmetic operation circuit and a neuromorphic device.

BACKGROUND ART

For the purpose of improvement of power performance of neuromorphic devices that perform arithmetic operations using a neural network, nervous system models have been studied and developed. Examples of such a nervous system model include a spiking neural network (SNN) and the like.

As a method for realizing a spiking neural network, a method using a variable resistance element of a two-terminal type is known (for example, see Patent Literature 1). Here, the variable resistance element is an element of a two-terminal type capable of changing the resistance and is, for example, a resistive random access memory (ReRAM) or the like.

CITATION LIST

Patent Literature

[Patent Literature 1]

Japanese Unexamined Patent Application Publication (Translation of PCT Application) No. 2018-508922

SUMMARY OF INVENTION

Technical Problem

Here, conventionally, a method for realizing a spiking neural network using a variable resistance element of a three-terminal type is not known.

Solution to Problem

According to one aspect of the present invention, there is provided an arithmetic operation circuit including: a variable resistance element that includes three terminals that are a first terminal, a second terminal, and a third terminal and is configured to be able to change a resistance value; a first electrode connected to the first terminal; a second electrode; a third electrode; a first switching element connected between the second electrode and the second terminal; a second switching element connected between the third electrode and the third terminal; and a capacitor connected between a transmission line connecting the second terminal and the first switching element and the ground.

Advantageous Effects of Invention

According to the present invention, an arithmetic operation circuit and a neuromorphic device capable of realizing a spiking neural network using a variable resistance element of a three-terminal type can be provided.

DESCRIPTION OF EMBODIMENTS

Embodiment

Hereinafter, an embodiment of the present invention will be described with reference to the drawings. In the description of this embodiment, a conductor transmitting an electrical signal will be referred to as a transmission line. For example, the transmission line may be a conductor printed on a substrate, a wire such as a conductor or the like formed in a linear shape, or the like. In this embodiment, a voltage represents an electric potential difference from a predetermined reference electric potential, and illustration and description of the reference electric potential will be omitted. Here, the reference electric potential may be any electric potential. Hereinafter, as an example, a case in which the reference electric potential is the ground electric potential will be described.

<Configuration of Arithmetic Operation System>

Figure 1:
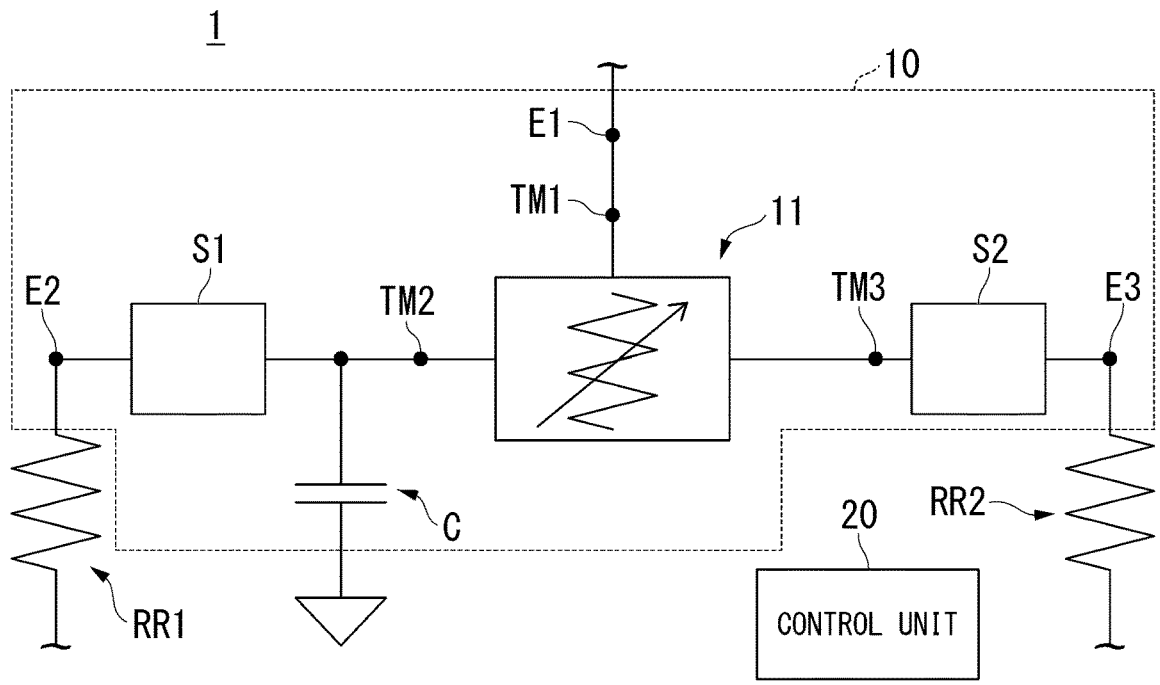
FIG. 1 is a diagram illustrating an example of the configuration of an arithmetic operation system 1 according to an embodiment.

FIG. 1 is a diagram illustrating an example of the configuration of an arithmetic operation system 1 according to an embodiment.

The arithmetic operation system 1 outputs a spike signal of a spiking neural network. The arithmetic operation system 1 includes an arithmetic operation circuit 10 and a control unit 20. Here, the control unit 20 controls the arithmetic operation circuit 10. For example, the control unit 20 is a microcomputer. The control unit 20 may be another circuit or another device that can control the arithmetic operation circuit 10 instead of the microcomputer.

The arithmetic operation circuit 10 has three electrodes that are a first electrode E1, a second electrode E2, and a third electrode E3. In addition, the arithmetic operation circuit 10 includes a variable resistance element 11, a first switching element S1, a second switching element S2, and a capacitor C.

The first electrode E1 is an electrode for the arithmetic operation circuit 10 to accept an input signal input to the arithmetic operation circuit 10. The first electrode E1 is connected to the control unit 20 through a transmission line not illustrated in the drawing. In addition, the first electrode E1 may be configured with another circuit, another device, or the like, which can input an input signal to the first electrode E1, connected the first electrode E1, instead of the control unit 20.

The second electrode E2 is an electrode that outputs a signal output by the arithmetic operation circuit 10 to another circuit. For example, the second electrode E2 outputs a spike signal output by the arithmetic operation circuit 10 to another circuit. In the example illustrated in FIG. 1, another circuit not illustrated in the drawing is connected to the second electrode E2 through a resistor RR1. In addition, the second electrode E2 may be configured to connect the another circuit without using the resistor RR1 or may be configured to the another circuit through another circuit element such as a comparator or the like. Furthermore, the second electrode E2 may be configured to connect a second electrode E2 of another arithmetic operation circuit 10 or may be configured to connect a first electrode E1 of another arithmetic operation circuit 10. In addition, the arithmetic operation circuit 10 may be configured to include the resistor RR1.

The third electrode E3 is an electrode that outputs a signal output by the arithmetic operation circuit 10 to another circuit, the ground, and the like. For example, the third electrode E3 outputs an input signal input to the arithmetic operation circuit 10 and a signal according to a resistance value of the variable resistance element 11 included in the arithmetic operation circuit 10 to another circuit, the ground, and the like. In the example illustrated in FIG. 1, another circuit not illustrated in the drawing is connected to the third electrode E3 through the resistor RR2. In addition, the third electrode E3 may be configured to connect the another circuit without using the resistor RR2 or may be configured to connect the another circuit through another circuit element such as a comparator or the like.

The variable resistance element 11 is an element that can change resistance. The variable resistance element 11 has three terminals that are a first terminal TM1, a second terminal TM2, and a third terminal TM3. In other words, the variable resistance element 11 is an element of a three-terminal type. Hereinafter, as one example, a case in which the variable resistance element 11 is a magnetoresistive effect element of a magnetic domain wall displacement type of which resistance changes in accordance with a current flowing between the second terminal TM2 and the third terminal TM3 will be described. In addition, the variable resistance element 11 may be any element as long as it is an element of a three-terminal type of which resistance can be changed instead of the magnetoresistive effect element of the magnetic domain wall displacement type.

Here, the magnetoresistive effect element is an element that uses a giant magnetoresistive effect, a tunnel magnetoresistive effect, or the like as a magnetoresistive effect. The magnetoresistive effect element has a resistance value that changes in accordance with a magnetization relation between two ferromagnetic layers included in the magnetoresistive effect element. The magnetoresistive effect element can change the magnetization relation between the two ferromagnetic layers using a spin polarization current. The magnetoresistive effect element of the magnetic domain wall displacement type is a magnetoresistive effect element that can change the magnetization relation between the two ferromagnetic layers by moving a magnetic domain wall in one ferromagnetic layer of the two ferromagnetic layers using a spin polarization current.

Figure 2:
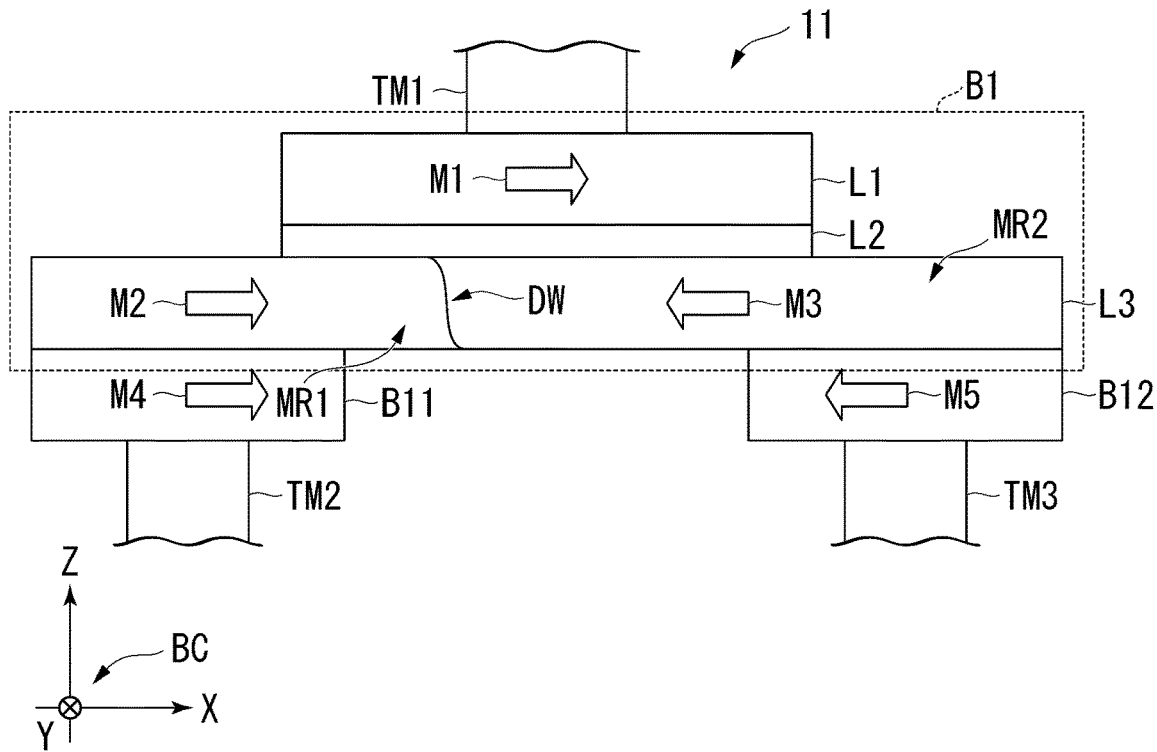
FIG. 2 is a diagram illustrating an example of the configuration of a variable resistance element 11.

Here, the configuration of the variable resistance element 11 will be described with reference to FIG. 2. FIG. 2 is a diagram illustrating an example of the configuration of the variable resistance element 11.

The variable resistance element 11 includes a variable resistance unit B1, a magnetization fixing unit B11, and a magnetization fixing unit B12 in addition to three terminals that are a first terminal TM1, a second terminal TM2, and a third terminal TM3.

The variable resistance unit B1 includes two ferromagnetic layers. The variable resistance unit B1 has a resistance value that changes in accordance with a magnetization relation between these two ferromagnetic layers. More specifically, the variable resistance unit B1 includes a ferromagnetic layer L1, a non-magnetic layer L2, and a magnetic recording layer L3. Hereinafter, as one example, a case in which the shape of the magnetic recording layer L3 is a rectangular parallelepiped of a plate shape will be described. The shape of the magnetic recording layer L3 may be another shape instead of this.

Here, a three-dimensional coordinate system BC illustrated in FIG. 2 is a three-dimensional orthogonal coordinate system of a right-handed type in which an X-axis direction coincides with a longitudinal direction of the magnetic recording layer L3, and a Y-axis direction coincides with a lateral direction of the magnetic recording layer L3. In other words, the variable resistance element 11 illustrated in FIG. 2 is a variable resistance element 11 when seen in a negative direction of the Y axis in the three-dimensional coordinate system BC. In the following description, for the convenience of description, a positive direction of the Z axis in the three-dimensional coordinate system BC will be referred to as an upper side or an upward direction, and a negative direction of the Z axis will be referred to as a lower side or a downward direction.

In the variable resistance unit B1, the ferromagnetic layer L1, the non-magnetic layer L2, and the magnetic recording layer L3, as illustrated in FIG. 2, are stacked in order of the magnetic recording layer L3, the non-magnetic layer L2, and the ferromagnetic layer L1 upward from the bottom.

The ferromagnetic layer L1 contains a ferromagnetic material. The ferromagnetic layer L1 is one of two ferromagnetic layers included in the variable resistance unit B1. In the ferromagnetic layer L1, the direction of magnetization is fixed. A direction M1 of an arrow illustrated in FIG. 2 illustrates an example of the direction of magnetization that is fixed in the ferromagnetic layer L1. In the example illustrated in FIG. 2, the direction M1 coincides with a positive direction of the X axis in the three-dimensional coordinate system BC.

In the example illustrated in FIG. 2, the first terminal TM1 described above is disposed on the ferromagnetic layer L1.

As the ferromagnetic material composing the ferromagnetic layer L1, for example, a metal selected from the group consisting of Cr, Mn, Co, Fe, and Ni, an alloy containing one or more of these metals, and an alloy containing at least one or more of these metals, B, C, and N, and the like can be used. More specifically, examples of the ferromagnetic material include Co—Fe, Co—Fe—B, and Ni—Fe.

In addition, the material composing the ferromagnetic layer L1 may be a Heusler alloy. A Heusler alloy is a half metal and has high spin polarizability. A Heusler alloy is an intermetallic compound having a chemical composition of $X_2YZ$. Here, X is a transition metal element or a noble metal element of the Co, Fe, Ni, or Cu group on the periodic table. Y is an element type of a transition metal of the Mn, V, Cr, or Ti group or X. Z is a typical element of one of group III to group V. Examples of Heusler alloys include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

In a case in which magnetization of the ferromagnetic layer L1 is oriented in a direction along an XY plane (the ferromagnetic layer L1 is set as an in-plane magnetization film), for example, it is preferable to use NiFe. The XY plane is a plane that is parallel to both the X axis and the Y axis in the three-dimensional coordinate system BC. On the other hand, in a case in which magnetization of the ferromagnetic layer L1 is oriented in a direction along a Z axis (the ferromagnetic layer L1 is set as a vertical magnetization film), for example, it is preferable to use a Co/Ni laminated film, a Co/Pt laminated film, or the like. This Z axis is the Z axis in the three-dimensional coordinate system BC.

For fixing magnetization, the structure of the ferromagnetic layer L1 may be a synthetic structure formed from a ferromagnetic layer and a non-magnetic layer or may be a synthetic structure formed from an antiferromagnetic layer, a ferromagnetic layer, and a non-magnetic layer. In a case in which the structure of the ferromagnetic layer L1 is the synthetic structure formed from an antiferromagnetic layer, a ferromagnetic layer, and a non-magnetic layer, the direction of the magnetization of the ferromagnetic layer L1 is maintained more strongly by the antiferromagnetic layer. For this reason, in such a case, the magnetization of the ferromagnetic layer L1 becomes unlikely to be affected by the outside.

A known material may be used for the non-magnetic layer L2. For example, in a case in which the non-magnetic layer L2 is composed of an insulating body (in other words, the non-magnetic layer L2 is a tunnel barrier layer), $Al_2O_3$, $SiO_2$, MgO, $MgAl_2O_4$, or the like may be used as the material thereof. In addition, a material obtained by substituting some of Al, Si, or Mg with Zn, Be, or the like may be used for the non-magnetic layer L2. In a case in which the non-magnetic layer L2 is composed of a metal, Cu, Au, Ag, or the like may be used as the material thereof. Furthermore, in a case in which the non-magnetic layer L2 is composed of a semiconductor, Si, Ge, $CuInSe_2$, $CuGaSe_2$, $Cu(In, Ga)Se_2$, or the like may be used as the material thereof.

The magnetic recording layer L3 includes a ferromagnetic body. The magnetic recording layer L3 is the other of the two ferromagnetic layers included in the variable resistance unit B1. A magnetic domain wall DW is included inside the magnetic recording layer L3. The magnetic domain wall DW is a boundary between a magnetic domain MR1 and a magnetic domain MR2 of which magnetization directions are opposite directions inside the magnetic recording layer L3. In other words, there are two magnetic domains including the magnetic domain MR1 and the magnetic domain MR2 inside the magnetic recording layer L3. A direction M2 of an arrow illustrated in FIG. 2 represents an example of the magnetization direction of the magnetic domain MR1. In the example illustrated in FIG. 2, the direction M2 coincides with the positive direction of the X axis in the three-dimensional coordinate system BC. A direction M3 of an arrow illustrated in FIG. 2 represents an example of the magnetization direction of the magnetic domain MR2. In the example illustrated in FIG. 2, the direction M3 coincides with the negative direction of the X axis in the three-dimensional coordinate system BC.

The magnetization fixing unit B11 is disposed under an end part disposed on the magnetic domain MR1 side among end parts of the magnetic recording layer L3. The second terminal TM2 described above is disposed under the magnetization fixing unit B11.

As a ferromagnetic material composing the magnetic recording layer L3, a material that is similar to that of the ferromagnetic layer L1 may be used. The ferromagnetic material composing the magnetic recording layer L3 may be a ferromagnetic material that is different from the ferromagnetic material composing the ferromagnetic layer L1 among ferromagnetic materials that can be used for composing the ferromagnetic layer L1.

The magnetization fixing unit B11 includes a ferromagnetic body. In the magnetization fixing unit B11, the direction of magnetization is fixed. A direction M4 of an arrow illustrated in FIG. 2 represents an example of the direction of magnetization (or a spin direction) fixed in the magnetization fixing unit B11. In the example illustrated in FIG. 2, the direction M4 coincides with the positive direction of the X axis in the three-dimensional coordinate system BC.

A material composing the magnetization fixing unit B11 may be any material as long as it can compose the ferromagnetic layer L1.

In order to fix magnetization, the structure of the magnetization fixing unit B11 may be a synthetic structure formed from a ferromagnetic layer and a non-magnetic layer or a synthetic structure formed from an antiferromagnetic layer, a ferromagnetic layer, and a non-magnetic layer. In a case in which the structure of the magnetization fixing unit B11 is the synthetic structure formed from an antiferromagnetic layer, a ferromagnetic layer, and a non-magnetic layer, the direction of magnetization of the magnetization fixing unit B11 is maintained more strongly by the antiferromagnetic layer. For this reason, in such a case, the magnetization of the magnetization fixing unit B11 becomes unlikely to be affected by the outside.

The magnetization fixing unit B12 is disposed under an end part disposed on the magnetic domain MR2 side among end parts of the magnetic recording layer L3. The third terminal TM3 described above is disposed under the magnetization fixing unit B12.

The magnetization fixing unit B12 includes a ferromagnetic body. In the magnetization fixing unit B12, the direction of magnetization is fixed. A direction M5 of an arrow illustrated in FIG. 2 represents an example of the direction of magnetization fixed in the magnetization fixing unit B12. In the example illustrated in FIG. 2, the direction M5 coincides with the negative direction of the X axis in the three-dimensional coordinate system BC.

A material composing the magnetization fixing unit B12 may be any material as long as it can compose the ferromagnetic layer L1.

In order to fix magnetization, the structure of the magnetization fixing unit B12 may be a synthetic structure formed from a ferromagnetic layer and a non-magnetic layer or a synthetic structure formed from an antiferromagnetic layer, a ferromagnetic layer, and a non-magnetic layer. In a case in which the structure of the magnetization fixing unit B12 is the synthetic structure formed from an antiferromagnetic layer, a ferromagnetic layer, and a non-magnetic layer, the direction of magnetization of the magnetization fixing unit B12 is maintained more strongly by the antiferromagnetic layer. For this reason, the magnetization of the magnetization fixing unit B12 is unlikely to be affected by the outside.

In this way, since the magnetization fixing unit B11 is disposed between the magnetic recording layer L3 and the second electrode E2, in a case in which a current flows from the second terminal TM2 to the third terminal TM3 sequentially through the magnetization fixing unit B11 and the magnetic recording layer L3, spin-polarized electrons flow from the third terminal TM3 to the second terminal TM2 in the same direction as the direction M4 of magnetization of the magnetization fixing unit B11 in the magnetic recording layer L3. More specifically, in a case in which a voltage is applied between the second terminal TM2 and the third terminal TM3 such that the electric potential of the third terminal TM3 is lower than the electric potential of the second terminal TM2, the electrons flow from the second terminal TM2 side to the third terminal TM3 side in the magnetic recording layer L3.

In addition, since the magnetization fixing unit B12 is disposed between the magnetic recording layer L3 and the third terminal TM3, in a case in which a current flows from the third terminal TM3 to the second terminal TM2 sequentially through the magnetization fixing unit B12 and the magnetic recording layer L3, spin-polarized electrons flow from the third terminal TM3 to the second terminal TM2 in the same direction as the direction M5 of magnetization of the magnetization fixing unit B12 in the magnetic recording layer L3. More specifically, in a case in which a voltage is applied between the second terminal TM2 and the third terminal TM3 such that the electric potential of the third terminal TM3 is higher than the electric potential of the second terminal TM2, the electrons flow from the third terminal TM3 side to the second terminal TM2 side in the magnetic recording layer L3.

Here, in a case in which the position of the magnetic domain wall DW is moved inside the magnetic recording layer L3, a ratio between a volume occupied by the magnetic domain MR1 and a volume occupied by the magnetic domain MR2 inside the magnetic recording layer L3 changes. In the example illustrated in FIG. 2, the direction M1 of magnetization of the ferromagnetic layer L1 is the same as the direction M2 of magnetization of the magnetic domain MR1 and is opposite to the direction M3 of magnetization of the magnetic domain MR2.

An area in which the ferromagnetic layer L1 and the magnetic domain MR1 overlap each other when the variable resistance unit B1 is seen in the negative direction of the Z axis in the three-dimensional coordinate system BC increases in a case in which the magnetic domain wall DW is moved in the positive direction of the X axis in the three-dimensional coordinate system BC. As a result, in such a case, the resistance value of the variable resistance element 11 decreases in accordance with a magnetoresistive effect. On the other hand, in a case in which the magnetic domain wall DW is moved in the negative direction of the X axis, the area decreases. As a result, in such a case, the resistance value of the variable resistance element 11 increases in accordance with a magnetoresistive effect. The resistance value of the variable resistance element 11 is the resistance value of the variable resistance unit B1 acting as a resistor for a current flowing from the first terminal TM1 that is electrically connected to the ferromagnetic layer L1 to the second terminal TM2. In addition, the resistance value of the variable resistance element 11 is also the resistance value of the variable resistance unit B1 acting as a resistor for a current flowing from the first terminal TM1 that is electrically connected to the ferromagnetic layer L1 to the third terminal TM3.

As a ferromagnetic material composing the magnetic recording layer L3, the same material as that of the ferromagnetic layer L1 can be used. In addition, it is preferable that the magnetic recording layer L3 have at least one element selected from the group consisting of Co, Ni, Pt, Pd, Gd, Tb, Mn, Ge, and Ga. In a case in which vertical magnetization is used in the magnetic recording layer L3, examples of the ferromagnetic material composing the magnetic recording layer L3 include a laminated film of Co and Ni, a laminated film of Co and Pt, a laminated film of Co and Pd, a MnGa-based material, a GdCo-based material, and a TbCo-based material. A ferrimagnetic body of the MnGa-based material, the GdCo-based material, the TbCo-based material, or the like has small saturation magnetization and can decrease a threshold current required for moving the magnetic domain wall DW. In addition, each of the laminated film of Co and Ni, the laminated film of Co and Pt, and the laminated film of Co and Pd has a large coercive force and can inhibit the moving speed of the magnetic domain wall DW.

Here, as described above, in the variable resistance unit B1, the magnetic domain wall DW moves in accordance with the flow of a current between the second terminal TM2 and the third terminal TM3. This current may be either a current having a constant current value or a pulse current.

In other words, in a case in which a current flows from the third terminal TM3 to the second terminal TM2, the magnetic domain MR2 spreads in the direction of the magnetic domain MR1. As a result, the magnetic domain wall DW moves in the direction of the magnetic domain MR1. On the other hand, in this example, in a case in which a current flows from the second terminal TM2 to the third terminal TM3, the magnetic domain MR1 spreads in the direction of the magnetic domain MR2. As a result, the magnetic domain wall DW moves in the direction of the magnetic domain MR2.

In this way, in the variable resistance unit B1, the position of the magnetic domain wall DW moves in accordance with the direction of a current flowing between the second terminal TM2 and the third terminal TM3 (in other words, the direction of a current flowing to the magnetic recording layer L3) and the intensity of the current, and the resistance value of the variable resistance element 11 changes.

Description will be presented by referring back to FIG. 1. As described above, the first electrode E1 is connected to the first terminal TM1 of the variable resistance element 11 having such a configuration through a transmission line. In addition, circuit elements such as a resistor, a capacitor, and the like may be configured to be connected between the first terminal TM1 and the first electrode E1 unless the function of the arithmetic operation circuit 10 described in this embodiment is not damaged. Furthermore, other circuits and other devices may be configured to be connected between the first terminal TM1 and the first electrode E1 unless the function of the arithmetic operation circuit 10 described in this embodiment is not damaged.

The first switching element S1 is controlled by the control unit 20. In addition, the first switching element S1 may be configured to be controlled by another circuit or another device that can control the first switching element S1 instead of the control unit 20. The first switching element S1 is connected between the second electrode E2 and the second terminal TM2 through a transmission line. More specifically, the first switching element S1 is connected to the second electrode E2 through a transmission line and is connected to the second terminal TM2 through a transmission line. In other words, the first switching element S1 is a switching element that changes a conduction state between the second electrode E2 and the second terminal TM2. In a case in which the state of the first switching element S1 is an on state, the conduction state between the second electrode E2 and the second terminal TM2 becomes an electrically-connected state. On the other hand, in a case in which the state of the first switching element S1 is an off state, the conduction state between the second electrode E2 and the second terminal TM2 becomes an electrically-disconnected state.

Hereinafter, as an example, a case in which the first switching element S1 is a field effect transistor will be described. In this case, a source terminal of the first switching element S1 is connected to the second electrode E2 through a transmission line. In addition, in this case, a drain terminal of the first switching element S1 is connected to the second terminal TM2 through a transmission line. Furthermore, in this case, a gate terminal of the first switching element S1 is connected to the control unit 20 through a transmission line. In FIG. 1, in order to prevent complications of the drawing, the transmission line connecting the gate terminal and the control unit 20 is omitted. Instead of the field effect transistor, the first switching element S1 may be any other transistor such as a bipolar transistor or another switching element different from a transistor.

In a case in which the first switching element S1 is a field effect transistor, the state of the first switching element S1 being the on state represents that the conduction state between the source terminal of the first switching element S1 and the drain terminal of the first switching element S1 is the electrically-connected state. In addition, in such a case, the state of the first switching element S1 being the off state represents that the conduction state between the source terminal of the first switching element S1 and the drain terminal of the first switching element S1 is the electrically-disconnected state.

The second switching element S2 is controlled by the control unit 20. In addition, the second switching element S2 may be configured to be controlled by another circuit or another device that can control the second switching element S2 instead of the control unit 20. The second switching element S2 is connected between the third electrode E3 and the third terminal TM3 through a transmission line. More specifically, the second switching element S2 is connected to the third electrode E3 through a transmission line and is connected to the third terminal TM3 through a transmission line. In other words, the second switching element S2 is a switching element that changes a conduction state between the third electrode E3 and the third terminal TM3. In a case in which the state of the second switching element S2 is the on state, the conduction state between the third electrode E3 and the third terminal TM3 becomes an electrically-connected state. On the other hand, in a case in which the state of the second switching element S2 is the off state, the conduction state between the third electrode E3 and the third terminal TM3 becomes an electrically-disconnected state.

Hereinafter, as an example, a case in which the second switching element S2 is a field effect transistor will be described. In this case, a source terminal of the second switching element S2 is connected to the third electrode E3 through a transmission line. In addition, in this case, a drain terminal of the second switching element S2 is connected to the third terminal TM3 through a transmission line. Furthermore, in this case, a gate terminal of the second switching element S2 is connected to the control unit 20 through a transmission line. In FIG. 1, in order to prevent complications of the drawing, the transmission line connecting the gate terminal and the control unit 20 is omitted. Instead of the field effect transistor, the second switching element S2 may be any other transistor such as a bipolar transistor or another switching element different from a transistor.

In a case in which the second switching element S2 is a field effect transistor, the state of the second switching element S2 being the on state represents that the conduction state between the source terminal of the second switching element S2 and the drain terminal of the second switching element S2 is the electrically-connected state. In addition, in such a case, the state of the second switching element S2 being the off state represents that the conduction state between the source terminal of the second switching element S2 and the drain terminal of the second switching element S2 is the electrically-disconnected state.

The capacitor C is connected between the transmission line connecting the second terminal TM2 and the first switching element S1 and the ground through a transmission line. More specifically, one of two terminals of the capacitor C is connected to this transmission line. The other of the two terminals of the capacitor C is grounded.

Here, an operation performed by the arithmetic operation circuit 10 having such a configuration will be described. Hereinafter, for the convenience of description, in the arithmetic operation circuit 10, a case in which the state of the first switching element S1 is the off state, and the state of the second switching element S2 is the off state will be referred to as the state of the arithmetic operation circuit 10 being a first state in description. In addition, hereinafter, for the convenience of description, in the arithmetic operation circuit 10, a case in which the state of the first switching element S1 is the on state, and the state of the second switching element S2 is the off state will be referred to as the state of the arithmetic operation circuit 10 being a second state in description. Furthermore, hereinafter, for the convenience of description, in the arithmetic operation circuit 10, a case in which the state of the first switching element S1 is the off state, and the state of the second switching element S2 is the on state will be referred to as the state of the arithmetic operation circuit 10 being a third state in description.

In the arithmetic operation circuit 10, when an input signal is input to the first electrode E1, the capacitor C is charged in a case in which the state of the arithmetic operation circuit 10 is the first state. In this embodiment, an input of a certain input signal to the first electrode E1 represents application of a voltage corresponding to the input signal to the first electrode E1. In the case, in a case in which the input signal is input to the first electrode E1, a current flows from the first electrode E1 to the capacitor C in accordance with the voltage applied to the first electrode E1. In accordance with this, the capacitor C is charged (in other words, electric charge is accumulated in the capacitor C). For this reason, for example, in a case in which the input signal is a signal that represents one of a plurality of input parameters in a spiking neural network, electric charge required for generating a spike signal corresponding to the input parameter is accumulated in the capacitor C.

In addition, in a case in which the state of the arithmetic operation circuit 10 is the first state, and in a case in which the capacitor C is a charged state (in a case in which the amount of electric charge accumulated in the capacitor C is non-zero), when the state of the arithmetic operation circuit 10 is changed from the first state to the second state in a state in which no input signal is input to the first electrode E1, the arithmetic operation circuit 10 outputs a signal corresponding to a discharge current of the capacitor C from the second electrode E2. In the spiking neural network, the signal is handled as the spike signal described above. In addition, in a case in which the state of the arithmetic operation circuit 10 is changed from the first state to the second state, the state of the first switching element S1 is changed from the off state to the on state with the state of the second switching element S2 maintained as being the off state.

Figure 3:
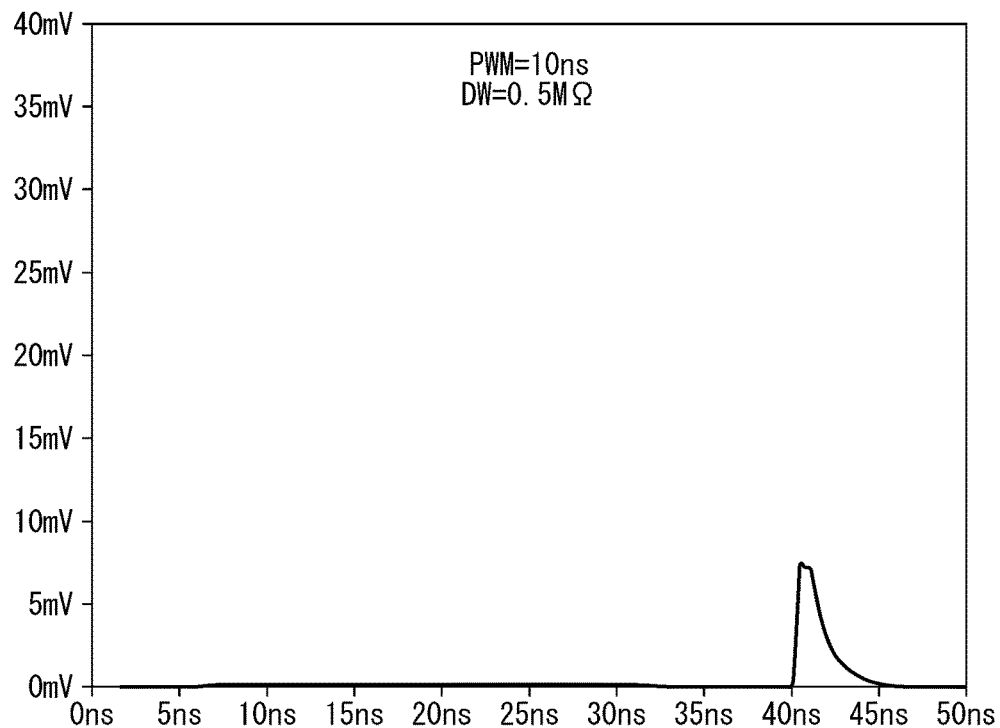
FIG. 3 is a diagram illustrating an example of a waveform of a signal output from a second electrode E2 of an arithmetic operation circuit 10.

Here, FIG. 3 is a diagram illustrating an example of a waveform of a signal output from the second electrode E2 of the arithmetic operation circuit 10. In a graph represented in FIG. 3, the vertical axis represents a voltage. In this graph, the horizontal axis represents an elapsed time from a timing that is represented by the origin of the horizontal axis. The waveform represented in the graph is a waveform of a signal corresponding to a discharge current of a charged capacitor C in a case in which the resistance value of the variable resistance element 11 is 0.5 MΩ, and an input signal input to the first electrode E1 is a pulse signal having a pulse width of 10 ns and a peak value of 0.5 V.

Figure 4:
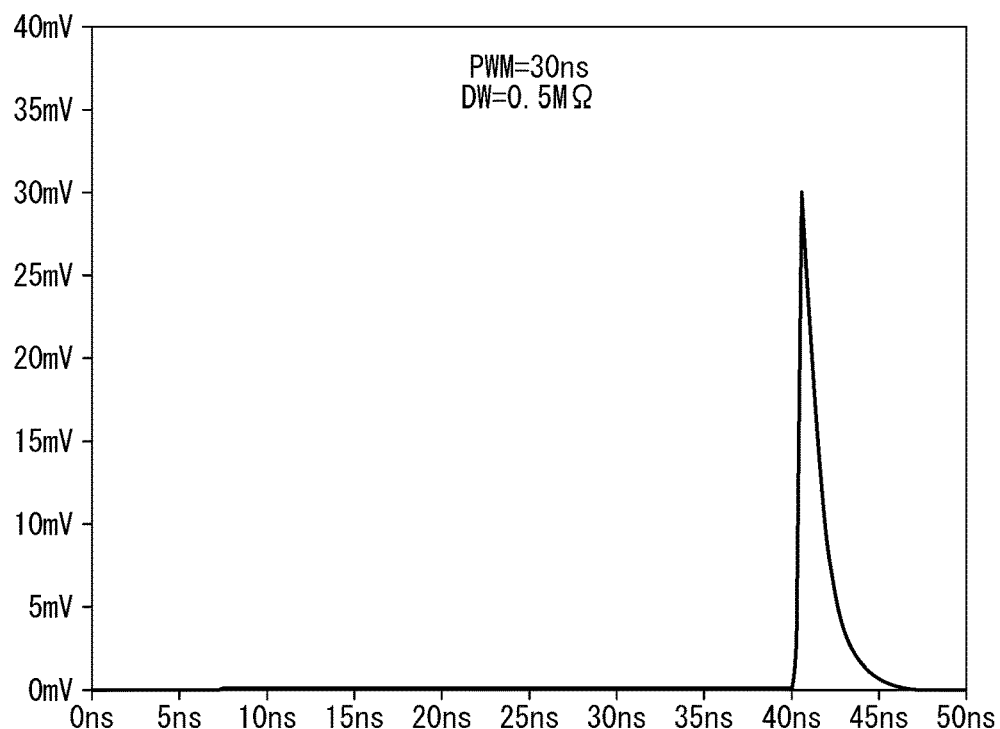
FIG. 4 is a diagram illustrating another example of a waveform of a signal output from the second electrode E2 of the arithmetic operation circuit 10.

FIG. 4 is a diagram illustrating another example of a waveform of a signal output from the second electrode E2 of the arithmetic operation circuit 10. In a graph represented in FIG. 4, the vertical axis represents a voltage. In this graph, the horizontal axis represents an elapsed time from a timing that is represented by the origin of the horizontal axis. The waveform represented in the graph is a waveform of a signal corresponding to a discharge current of a charged capacitor C in a case in which the resistance value of the variable resistance element 11 is 0.5 MΩ, and an input signal input to the first electrode E1 is a pulse signal having a pulse width of 30 ns and a peak value of 0.5 V.

Figure 5:
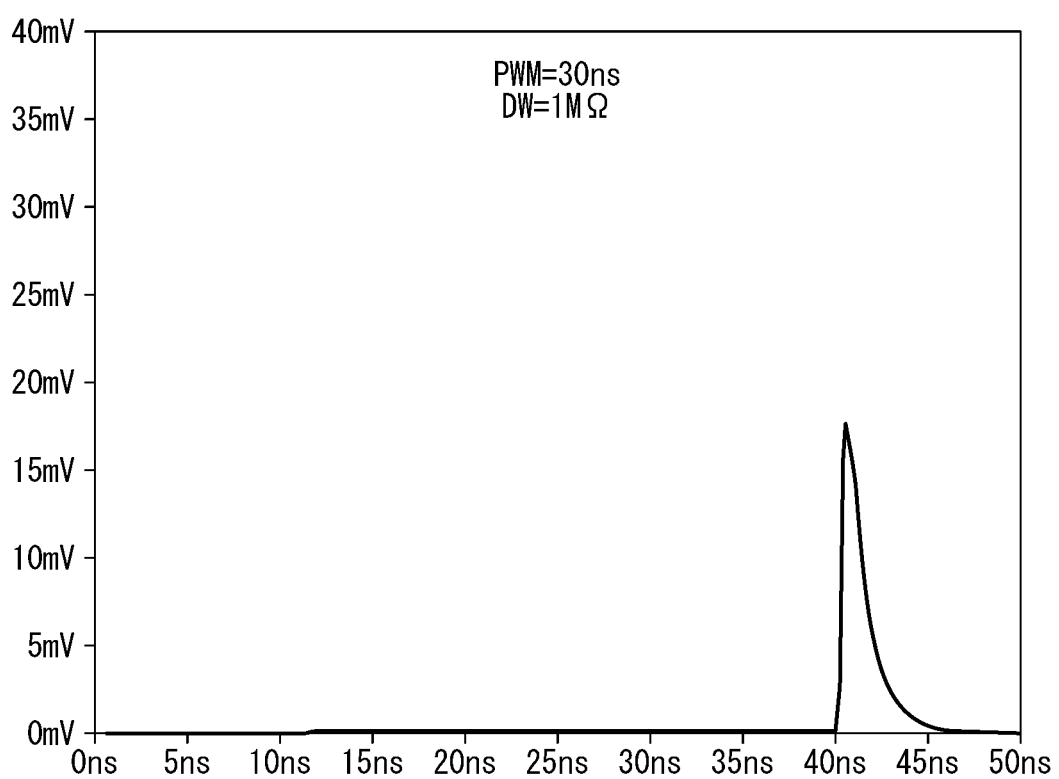
FIG. 5 is a diagram illustrating still another example of a waveform of a signal output from the second electrode E2 of the arithmetic operation circuit 10.

FIG. 5 is a diagram illustrating still another example of a waveform of a signal output from the second electrode E2 of the arithmetic operation circuit 10. In a graph represented in FIG. 5, the vertical axis represents a voltage. In this graph, the horizontal axis represents an elapsed time from a tuning that is represented by the origin of the horizontal axis. The waveform represented in the graph is a waveform of a signal corresponding to a discharge current of a charged capacitor C in a case in which the resistance value of the variable resistance element 11 is 1 MΩ, and an input signal input to the first electrode E1 is a pulse signal having a pulse width of 30 ns and a peak value of 0.5 V.

As illustrated in FIGS. 3 to 5, by including the capacitor C, the arithmetic operation circuit 10 can output a signal corresponding to a discharge current of the capacitor C from the second electrode E2 as a spike signal in the spiking neural network.

As above, an arithmetic operation circuit (the arithmetic operation circuit 10 in the example described above) including: a variable resistance element (the variable resistance element 11 in the example described above) that includes three terminals that are a first terminal (the first terminal TM1 in the example described above), a second terminal (the second terminal TM2 in the example described above), and a third terminal (the third terminal TM3 in the example described above) and is configured to be able to change a resistance value; a first electrode (the first electrode E1 in the example described above) connected to the first terminal; a second electrode (the second electrode E2 in the example described above); a third electrode (the third electrode E3 in the example described above); a first switching element (the first switching element S1 in the example described above) connected between the second electrode and the second terminal; a second switching element (the second switching element S2 in the example described above) connected between the third electrode and the third terminal; and a capacitor (the capacitor C in the example described above) connected between a transmission line connecting the second terminal and the first switching element and the ground. In accordance with this, the arithmetic operation circuit can realize a spiking neural network using the variable resistance element of a three-terminal type.

In addition, the arithmetic operation circuit may use a configuration in which the capacitor is configured to be charged when an input signal is input to the first electrode in a case in which both states of the first switching element and the second switching element are the off states.

In addition, the arithmetic operation circuit may use a configuration in which the arithmetic operation circuit is configured to output a signal corresponding to a discharge current of the capacitor from the second electrode when a state of the first switching element is changed to an on state with a state of the second switching element maintained to be an off state in a state in which no input signal is input to the first electrode in a case in which both the states of the first switching element and the second switching element are the off states and in a case in which the capacitor is in a charged state.

Modified Example 1 of Embodiment

Figure 6:
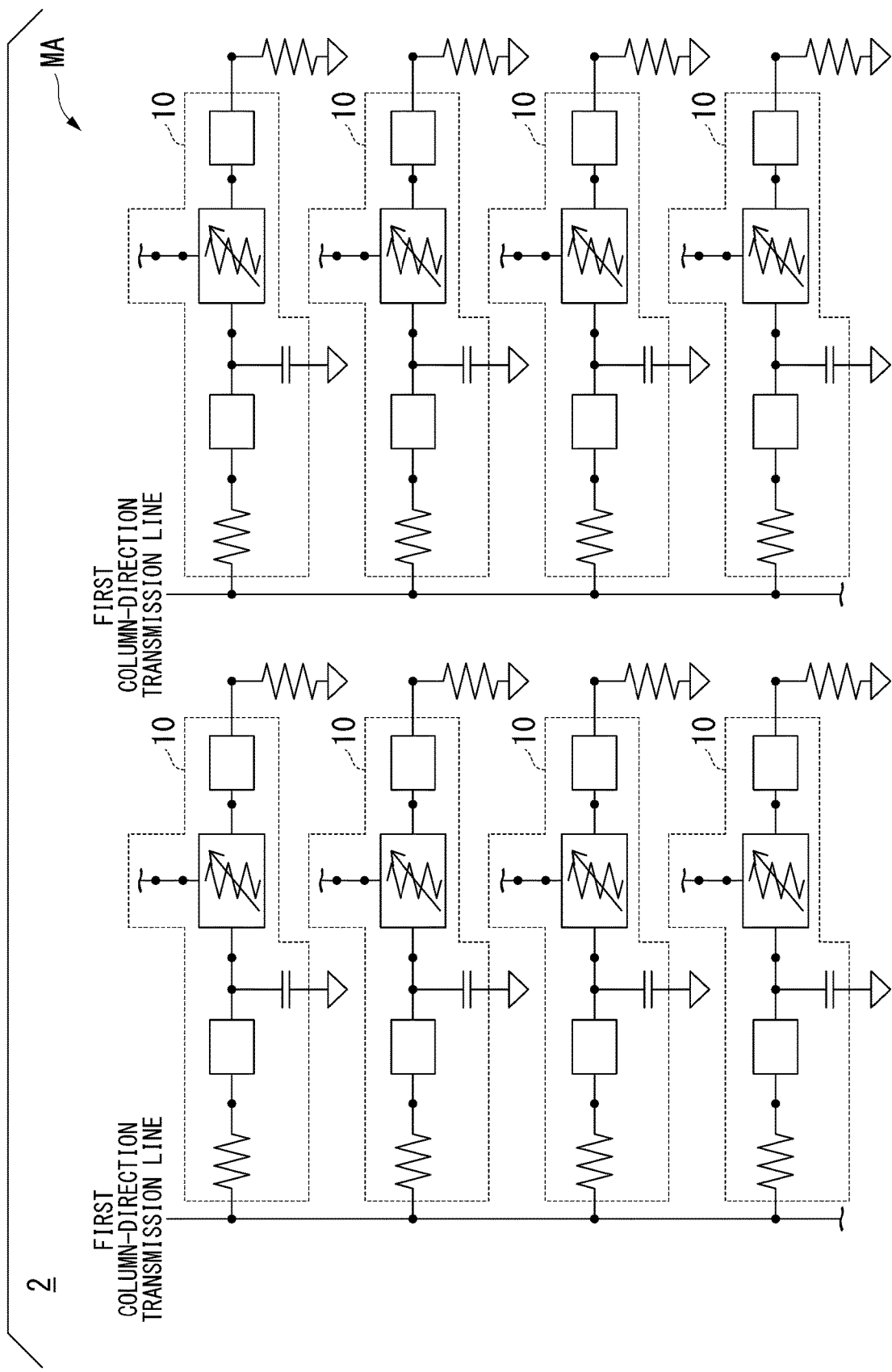
FIG. 6 is a diagram illustrating an example of the configuration of a neuromorphic device 2 according to Modified Example 1 of the embodiment.

Hereinafter, Modified Example 1 of the embodiment will be described with reference to FIG. 6. In Modified Example 1 of the embodiment, the same reference signs will be assigned to components similar to those of the embodiment, and description thereof will be omitted. Hereinafter, as one example, a case in which the arithmetic operation circuit 10 includes the resistor RR1 described above will be described. In this case, the second electrode E2 of the arithmetic operation circuit 10 is one of two terminals of the resistor RR1. The other of the two terminals of the resistor RR1 is connected to the source terminal of the first switching element S1 through a transmission line. Hereinafter, as one example, a case in which the resistance value of the resistor RR1 is smaller than the resistance value of the variable resistance element 11 by about two to three digits will be described. FIG. 6 is a diagram illustrating an example of the configuration of a neuromorphic device 2 according to Modified Example 1 of the embodiment.

The neuromorphic device 2 according to Modified Example 1 of the embodiment includes an array circuit MA that includes a plurality of arithmetic operation circuits 10 according to the embodiment and one or more control units 20A not illustrated in the drawing. Here, the control unit 20A controls the arithmetic operation circuits 10. For example, the control unit 20A is a microcomputer. The control unit 20A may be another circuit or another device that can control the arithmetic operation circuits 10 instead of the microcomputer.

Here, in the neuromorphic device 2, each of the arithmetic operation circuits 10 may be controlled by one control unit 20A or a plurality of control units 20A. Hereinafter, as one example, a case in which each of the arithmetic operation circuits 10 is controlled by one control unit 20A will be described. In other words, in this example, the neuromorphic device 2 includes one control unit 20A. In this example, the first electrode E1 of each of the arithmetic operation circuits 10 is connected to the control unit 20A. In accordance with this, the control unit 20A can input an input signal to the first electrode E1 of each of the arithmetic operation circuits 10. In this example, in the neuromorphic device 2, the gate terminal of each of the first switching element S1 and the second switching element S2 of each of the arithmetic operation circuits 10 is connected to the control unit 20A. In accordance with this, the control unit 20A can change the state of each of the arithmetic operation circuits 10 to one of the first state to the third state. In FIG. 6, in order to prevent complications of the drawing, the control unit 20A is omitted. In addition, some or all of the plurality of the arithmetic operation circuits 10 may be controlled by another circuit, another device, or the like instead of the control unit 20A.

In the example illustrated in FIG. 6, the array circuit MA includes eight arithmetic operation circuits 10 disposed in a matrix pattern. For example, the array circuit MA is a part of an analog product-sum operator configured as an integrated circuit. The neuromorphic device 2 including such an analog product-sum operator (in other words, the neuromorphic device 2 including the array circuit MA) can perform an arithmetic operation of a spiking neural network in an analog manner.

In the array circuit MA, second electrodes E2 of four arithmetic operation circuits 10 aligned in the direction of each column among the eight arithmetic operation circuits 10 disposed in a matrix pattern are connected to each other through a transmission line. Hereinafter, such a transmission line will be referred to as a first column-direction transmission line in description. In other words, the array circuit MA includes two first column-direction transmission lines. A spike signal, which is output from the second electrode E2 of each of four arithmetic operation circuits 10 aligned in the direction of each column, is output from an output terminal of each of two first column-direction transmission lines. For this reason, other circuits such as a comparator and the like are connected to an output terminal of each of the two first column-direction transmission lines. By using the other circuits, a process according to a spike signal output from the output terminal is performed. For example, the process is a process relating to a spiking neural network.

Figure 7:
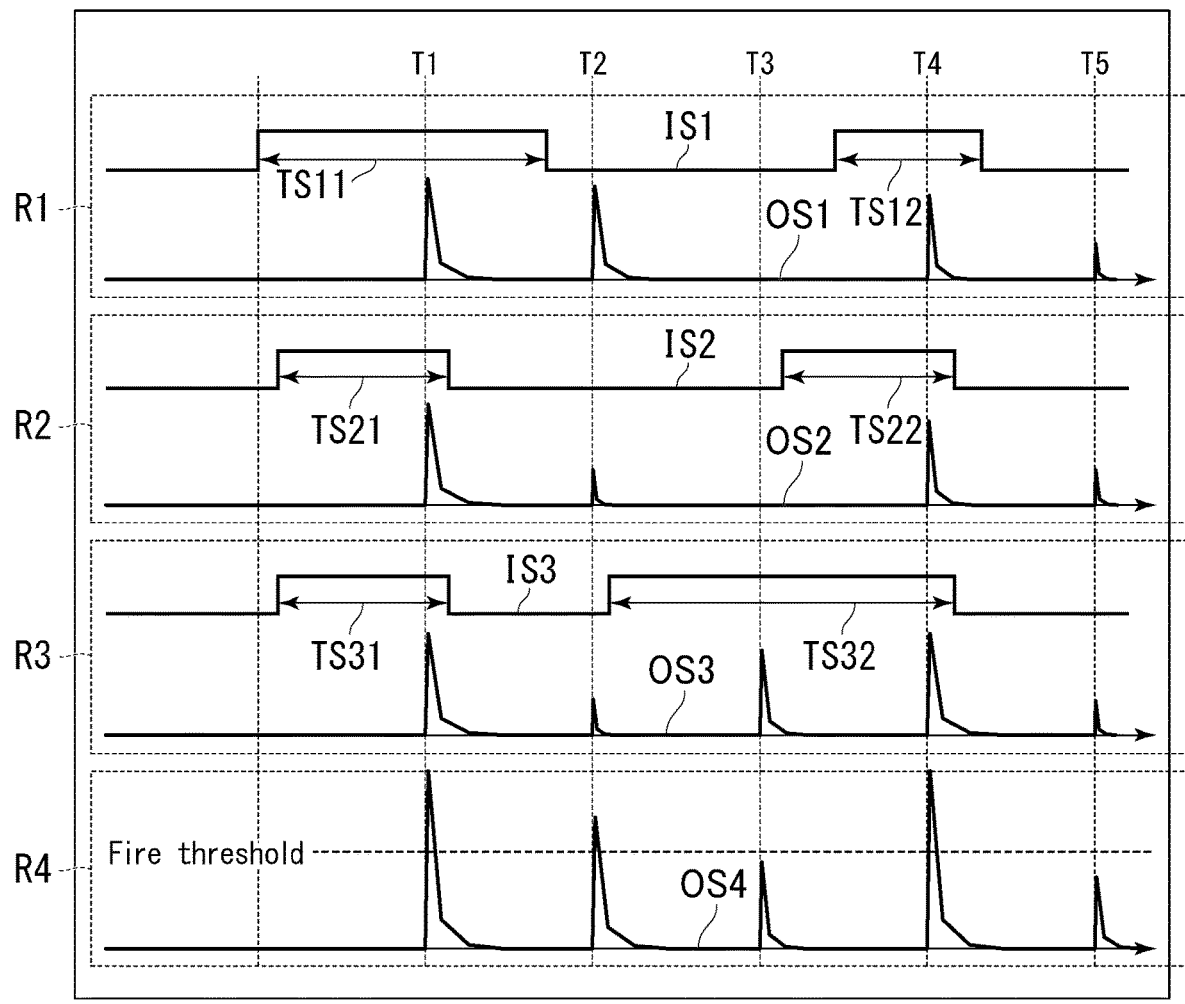
FIG. 7 is a timing diagram illustrating an example of changes over time in a voltage of a second electrode E2 of each of three arithmetic operation circuits 10 connected to a certain first column-direction transmission line of an array circuit MA.

Here, FIG. 7 is a timing diagram illustrating an example of changes over time in the voltage of the second electrode E2 of each of three arithmetic operation circuits 10 connected to a certain first column-direction transmission line of the array circuit MA. Hereinafter, for the convenience of description, the first column-direction transmission line will be referred to as a target transmission line in the description. In addition, hereinafter, for the convenience of description, a first arithmetic operation circuit 10 among the three arithmetic operation circuits 10 will be referred to as a first arithmetic operation circuit in the description. Furthermore, for the convenience of description, a second arithmetic operation circuit 10 among the three arithmetic operation circuits 10 will be referred to as a arithmetic operation circuit in the description. In addition, for the convenience of description, a third arithmetic operation circuit 10 among the three arithmetic operation circuits 10 will be referred to as a arithmetic operation circuit in the description. Hereinafter, as one example, a case in which the second electrodes E2 of the first arithmetic operation circuit, the second arithmetic operation circuit, and the third arithmetic operation circuit are connected to be sequentially aligned from the input terminal of the target transmission line to the output terminal of the target transmission line will be described.

Furthermore, FIG. 7 illustrates a timing diagram representing changes over time in the voltage of the output terminal of the target transmission line and timing diagrams illustrating changes over time in the voltages of the first electrodes E1 of the first arithmetic operation circuit to the third arithmetic operation circuit altogether.

A region R1 illustrated in FIG. 7 is a region that includes timing diagrams illustrating changes over time in the voltages of the first electrode E1 and the second electrode E2 of the first arithmetic operation circuit.

A region R2 illustrated in FIG. 7 is a region that includes timing diagrams illustrating changes over time in the voltages of the first electrode E1 and the second electrode E2 of the second arithmetic operation circuit.

A region R3 illustrated in FIG. 7 is a region that includes timing diagrams illustrating changes over time in the voltages of the first electrode E1 and the second electrode E2 of the third arithmetic operation circuit.

A region R4 illustrated in FIG. 7 is a region that includes a timing diagram illustrating changes over time in the voltage of the output terminal of the target transmission line.

A timing diagram IS1 illustrated in the region R1 illustrates an example of changes over time in the voltage of the first electrode E1 of the first arithmetic operation circuit. In addition, a timing diagram OS1 illustrated in the region R1 illustrates an example of changes over time in the voltage of the second electrode E2 of the first arithmetic operation circuit.

Furthermore, a timing diagram IS2 illustrated in the region R2 illustrates an example of changes over time in the voltage of the first electrode E1 of the second arithmetic operation circuit. In addition, a timing diagram OS2 illustrated in the region R2 illustrates an example of changes over time in the voltage of the second electrode E2 of the second arithmetic operation circuit.

Furthermore, a timing diagram IS3 illustrated in the region R3 illustrates an example of changes over time in the voltage of the first electrode E1 of the third arithmetic operation circuit. In addition, a timing diagram OS3 illustrated in the region R3 illustrates an example of changes over time in the voltage of the second electrode E2 of the third arithmetic operation circuit.

Furthermore, a timing diagram OS4 illustrated in the region R4 illustrates an example of changes over time in the voltage of the output terminal of the target transmission line.

A period TS11 and a period TS12 illustrated in FIG. 7 are periods in which an input signal is input to the first electrode E1 of the first arithmetic operation circuit by the control unit 20A. As illustrated in FIG. 7, the period TS12 is a period after the period TS11.

A period TS21 and a period TS22 illustrated in FIG. 7 are periods in which an input signal is input to the first electrode E1 of the second arithmetic operation circuit by the control unit 20A. As illustrated in FIG. 7, the period TS22 is a period after the period TS21.

A period TS31 and a period TS32 illustrated in FIG. 7 are periods in which an input signal is input to the first electrode E1 of the third arithmetic operation circuit by the control unit 20A. As illustrated in FIG. 7, the period TS32 is a period after the period TS31.

Five timings including timings T1 to T5 illustrated in FIG. 7 are timings at which the states of the first switching elements S1 of the first arithmetic operation circuit to the third arithmetic operation circuit are changed from the off state to the on state by the control unit 20A. At each of the five timings, the control unit 20A sets the states of the first switching elements S1 of the first arithmetic operation circuit to the third arithmetic operation circuit to the on state in a period before a predetermined time elapses. Then, at a timing at which the predetermined time has elapsed, the control unit 20A returns the states of the first switching elements S1 to the off state. In accordance with this, a spike signal corresponding to a discharge current of the capacitor C is output from the second electrode E2 of each of the first arithmetic operation circuit to the third arithmetic operation circuit within the period. As described above, in this example, the resistance value of the resistor RR1 is smaller than the resistance value of the variable resistance element 11 by about two to three digits. For this reason, in each of the first arithmetic operation circuit to the third arithmetic operation circuit, even when the state of the first switching element S1 becomes the on state in a state in which an input signal is input to the first electrode E1, as illustrated in FIG. 7, a spike signal is output from the second electrode E2.

Here, as illustrated in FIG. 7, spike signals output from the second electrodes E2 of the first arithmetic operation circuit to the third arithmetic operation circuit at the timing T1 are superimposed and are output from the output terminal of the target transmission line. In the timing diagram OS4, a spike signal appearing within a period from the timing T1 to the timing T2 is a signal acquired by superimposing spike signals output from the second electrodes E2 of the first arithmetic operation circuit to the third arithmetic operation circuit at the timing T1.

In addition, also in a partial period in the period from the timing T1 to the timing T2, the control unit 20A inputs an input signal to the first electrode E1 of each of the first arithmetic operation circuit to the third arithmetic operation circuit. For this reason, within this period, the capacitor C of each of the first arithmetic operation circuit to the third arithmetic operation circuit is charged. The reason why a spike signal output from the second electrode E2 of each of the first arithmetic operation circuit to the third arithmetic operation circuit appears at the timing T2 is that electric charge accumulated in the capacitor C within the period is output as a discharge current.

As illustrated in FIG. 7, spike signals output at the timing T2 from the second electrodes E2 of the first arithmetic operation circuit to the third arithmetic operation circuit are superimposed and are output from the output terminal of the target transmission line. In the timing diagram OS4, spike signals appearing within a period from the timing T2 to the timing T3 are signals acquired by superimposing spike signals output at the timing T2 from the second electrodes E2 of the first arithmetic operation circuit to the third arithmetic operation circuit.

In addition, within a period from the timing T2 to the timing T3, the arithmetic operation circuit 10 in which an input signal is input to the first electrode E1 is only the third arithmetic operation circuit. For this reason, the arithmetic operation circuit 10 that outputs a spike signal at the timing T3 is only the third arithmetic operation circuit.

As illustrated in FIG. 7, spike signals output from the second electrodes E2 of the first arithmetic operation circuit to the third arithmetic operation circuit (in the example illustrated in FIG. 7, only a spike signal output from the second electrode E2 of the third arithmetic operation circuit) at the timing T3 are superimposed and are output from the output terminal of the target transmission line. In the timing diagram OS4, a spike signal appearing within a period from the timing T3 to the timing T4 is a signal acquired by superimposing spike signals output from the second electrodes E2 of the first arithmetic operation circuit to the third arithmetic operation circuit at the timing T3.

In addition, also in at least a partial period in the period from the timing T3 to the timing T4, the control unit 20A inputs an input signal to the first electrode E1 of each of the first arithmetic operation circuit to the third arithmetic operation circuit. For this reason, within this period, the capacitor C of each of the first arithmetic operation circuit to the third arithmetic operation circuit is charged. For this reason, at the timing T4, a spike signal is output from the second electrode E2 of each of the first to third arithmetic operation circuits.

As illustrated in FIG. 7, spike signals output from the second electrode E2 from each of the first arithmetic operation circuit to the third arithmetic operation circuit at the timing T4 are superimposed and are output from the output terminal of the target transmission line. In the timing diagram OS4, a spike signal appearing within a period from the timing T4 to the timing T5 is a signal acquired by superimposing spike signals output from the second electrodes E2 of the first arithmetic operation circuit to the third arithmetic operation circuit at the timing T4.

Also in a partial period in the period from the timing T4 to the timing T5, the control unit 20A inputs an input signal to the first electrode E1 of each of the first arithmetic operation circuit to the third arithmetic operation circuit. For this reason, within this period, the capacitor C of each of the first arithmetic operation circuit to the third arithmetic operation circuit is charged. The reason why a spike signal output from the second electrode E2 of each of the first arithmetic operation circuit to the third arithmetic operation circuit appears at the timing T5 is that electric charge accumulated in the capacitor C within the period is output as a discharge current.

As illustrated in FIG. 7, spike signals output at the timing T5 from the second electrodes E2 of the first arithmetic operation circuit to the third arithmetic operation circuit are superimposed and are output from the output terminal of the target transmission line. In the timing diagram OS4, spike signals appearing within a period after the timing T5 are signals acquired by superimposing spike signals output at the timing T5 from the second electrodes E2 of the first arithmetic operation circuit to the third arithmetic operation circuit.

As above, in the example illustrated in FIG. 7, the control unit 20A controls the first switching elements S1 of the first arithmetic operation circuit to the third arithmetic operation circuit in synchronization with each other. As a result, the neuromorphic device 2, as illustrated in the timing diagram OS4, can output a signal acquired by superimposing spike signals output from the first arithmetic operation circuit to the third arithmetic operation circuit from the output terminal of the target transmission line. In other words, the neuromorphic device 2 can superimpose spike signals output from the arithmetic operation circuits 10 corresponding to neurons in the spiking neural network and perform a process according to a signal acquired through the superimposition. Here, "Fire Threshold" represented in the timing diagram OS4 illustrated in FIG. 7 illustrates an example of a threshold for the signal. For example, the neuromorphic device 2 can determine whether or not the magnitude of the signal exceeds the threshold using a comparator or the like connected to the target output terminal. Then, the neuromorphic device 2 can perform a process according to a determined result.

Figure 8:
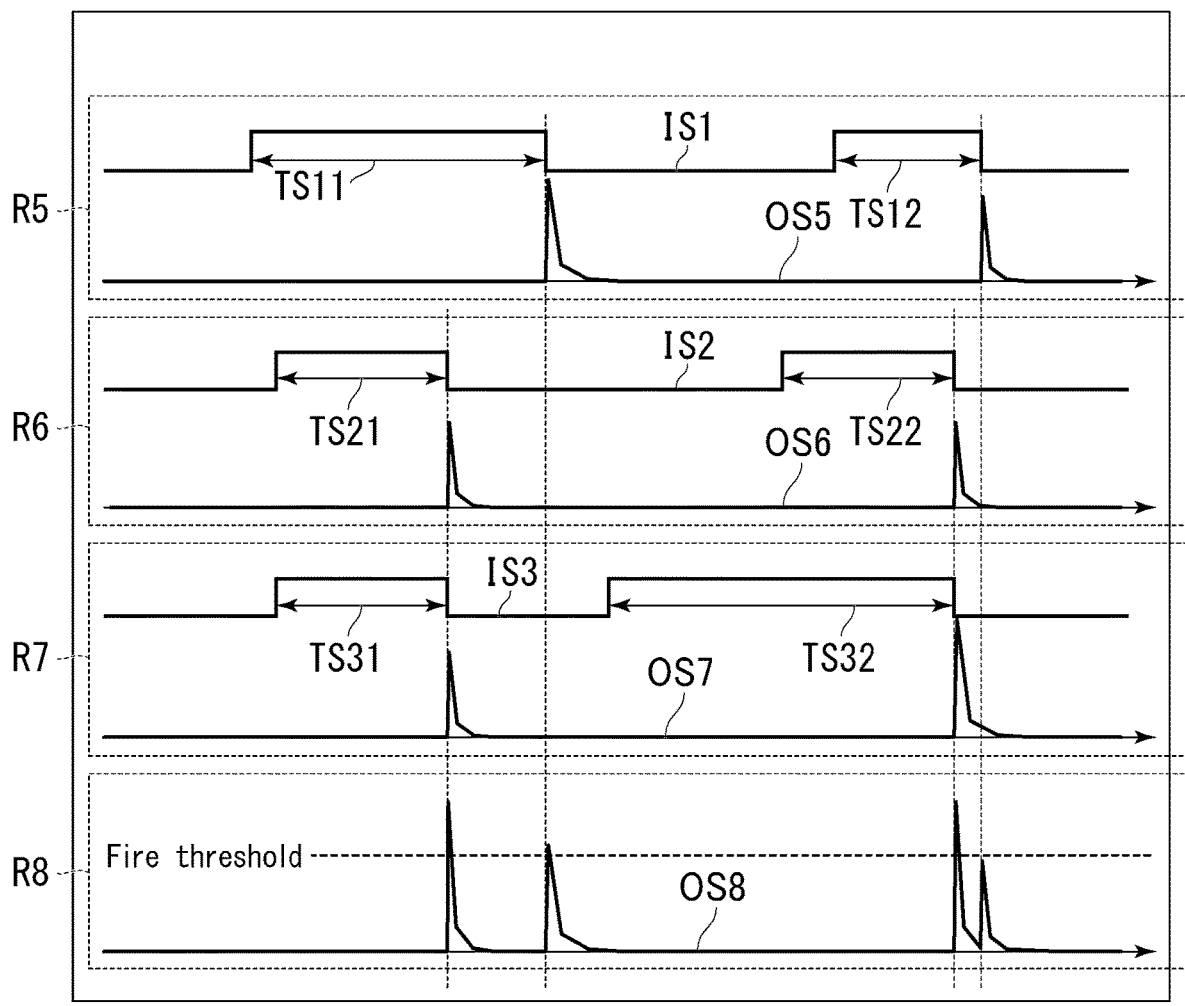
FIG. 8 is a timing diagram illustrating another example of changes over time in the voltage of a second electrode E2 of each of three arithmetic operation circuits 10 connected to a certain first column-direction transmission line of an array circuit MA.

In addition, the control unit 20, as illustrated in FIG. 8, may be configured to control the first switching elements S1 of the first arithmetic operation circuit to the third arithmetic operation circuit without causing them to be in synchronization with each other.

FIG. 8 is a timing diagram illustrating another example of changes over time in the voltage of the second electrode E2 of each of three arithmetic operation circuits 10 connected to a certain first column-direction transmission line of an array circuit MA.

A region R5 illustrated in FIG. 8 is a region that includes a timing diagram illustrating changes over time in the voltages of the first electrode E1 and the second electrode E2 of the first arithmetic operation circuit. In the region R5, a timing diagram OS5 is represented together with the timing diagram IS1 represented in FIG. 7. The timing diagram OS5 illustrates another example of changes over time in the voltage of the second electrode E2 of the first arithmetic operation circuit.

In addition, a region R6 illustrated in FIG. 8 is a region that includes a timing diagram illustrating changes over time in the voltages of the first electrode E1 and the second electrode E2 of the second arithmetic operation circuit. In the region R6, a timing diagram OS6 is represented together with the timing diagram IS2 represented in FIG. 7. The timing diagram OS6 illustrates another example of changes over time in the voltage of the second electrode E2 of the second arithmetic operation circuit.

A region R7 illustrated in FIG. 8 is a region that includes a timing diagram illustrating changes over time in the voltages of the first electrode E1 and the second electrode E2 of the third arithmetic operation circuit. In the region R7, a timing diagram OS7 is represented together with the timing diagram IS3 represented in FIG. 7. The timing diagram OS7 illustrates another example of changes over time in the voltage of the second electrode E2 of the third arithmetic operation circuit.

In addition, a region R8 illustrated in FIG. 8 is a region that includes a timing diagram illustrating changes over time in the voltage of the target output terminal. In the region R8, a timing diagram OS8 is represented. The timing diagram OS8 illustrates another example of changes over time in the voltage of the target output terminal.

Here, in the timing diagram OS5, a spike signal is output from the second electrode E2 of the first arithmetic operation circuit at each of a timing at which the period TS11 ends and a timing at which the period TS12 ends. In other words, this means that the control unit 20 controls the first switching element S1 of the first arithmetic operation circuit in synchronization with a timing at which input of an input signal to the first electrode E1 of the first arithmetic operation circuit ends. More specifically, this means that the control unit 20 changes the state of the first switching element S1 from the first state to the second state at the timing.

Also in the timing diagram OS6, a spike signal is output from the second electrode E2 of the second arithmetic operation circuit at each of a timing at which the period TS21 ends and a timing at which the period TS22 ends. In addition, also in the timing diagram OS7, a spike signal is output from the second electrode E2 of the third arithmetic operation circuit at each of a timing at which the period TS31 ends and a timing at which the period TS32 ends.

In this way, the control unit 20 may be configured to control the first switching element S1 of the arithmetic operation circuit 10 in synchronization with a timing at which input of an input signal to the first electrode E1 of the arithmetic operation circuit 10 ends for each of the first arithmetic operation circuit to the third arithmetic operation circuit. In other words, the control unit 20 may be configured to control the first switching elements S1 of the first arithmetic operation circuit to the third arithmetic operation circuit without causing them to be in synchronization with each other. In this case, for example, the neuromorphic device 2 can superimpose spike signals output from the second electrodes E2 of the arithmetic operation circuits 10 having high sensitivity for certain information (or a certain input signal) in the spiking neural network, and output a resultant signal from the output terminal of the target transmission line. Such superimposition of the spike signals can be regarded as being closer to a process performed in the human brain. For this reason, the arithmetic operation circuit 10 and the neuromorphic device 2 including the arithmetic operation circuit 10 can realize a spiking neural network that imitates a process performed by the human brain at a higher level.

Description will be presented by referring back to FIG. 6. The control unit 20 not illustrated in FIG. 6 is connected to input terminals of two first column-direction transmission lines. In accordance with this, the control unit 20 can change the resistance value of each arithmetic operation circuit 10 by inputting a signal such as a pulse signal or the like to the second electrode E2 of each arithmetic operation circuit 10.

In the array circuit MA illustrated in FIG. 6, the third electrodes E3 of four arithmetic operation circuits 10 aligned in the direction of each column among eight arithmetic operation circuits 10 disposed in a matrix pattern are grounded. In other words, such a third electrode E3 is used for causing a current for changing the resistance value of the variable resistance element 11 to flow between the second electrode E2 and the third electrode E3 in each arithmetic operation circuit 10. In addition, in the array circuit MA illustrated in FIG. 6, the third electrodes E3 of four arithmetic operation circuits 10 aligned in the direction of each column among the eight arithmetic operation circuits 10 may be configured to be connected to other circuits.

Here, the arithmetic operation circuit 10 according to this embodiment and the neuromorphic device 2 (or the array circuit MA) according to this embodiment can configure (or realize), for example, STDP (Spike-Timing Dependent Synaptic Plasticity) learning by changing the resistance of the variable resistance element 11 by causing a current to flow between the second electrode E2 and the third electrode E3 in each arithmetic operation circuit 10. The STDP learning is a model of machine learning that imitates a mechanism in which a causal relationship of positivity/negativity of an input signal sequence is obtained by a synapse using an electric potential difference applied between a pre synapse and a post synapse and a time difference thereof. More specifically, the resistance value of the variable resistance element is changed using an applied electric potential difference and a time difference, and the arithmetic operation circuit 10 according to this embodiment and the neuromorphic device 2 (or the array circuit MA) according to this embodiment can configure (or realize) such STDP learning by applying appropriate signals to the second electrode E2 and the third electrode E3.

As above, the neuromorphic device (in the example described above, the neuromorphic device 2) includes a plurality of arithmetic operation circuits (in the example described above, the arithmetic operation circuits 10). In this way, the neuromorphic device can realize a spiking neural network using a variable resistance element of a three-terminal type.

In addition, in the neuromorphic device, a configuration in which the second electrodes of at least some arithmetic operation circuits among a plurality of the arithmetic operation circuits are connected to each other may be employed.

In addition, the neuromorphic device may employ a configuration in which a control unit (the control unit 20 in the example described above) that controls the first switching elements of a plurality of arithmetic operation circuits is included, and the control unit controls the first switching elements of the plurality of arithmetic operation circuits in synchronization with each other.

In addition, the neuromorphic device may employ a configuration in which a control unit that controls the first switching elements of a plurality of arithmetic operation circuits is included, and the control unit controls the first switching elements of the plurality of arithmetic operation circuits without causing them to be in synchronization with each other.

Furthermore, the neuromorphic device may employ a configuration in which the control unit, for each of a plurality of arithmetic operation circuits, controls the first switching element of the arithmetic operation circuit in accordance with an input signal input to the first electrode of the arithmetic operation circuit.

In addition, in the array circuit MA of the neuromorphic device 2 described above, a configuration in which one control unit 20A is connected to each arithmetic operation circuit 10 may be employed. In other words, in the array circuit MA, each arithmetic operation circuit 10 may be controlled by a control unit 20A that is connected thereto. In addition, in the array circuit MA, at least some of a plurality of arithmetic operation circuits 10 may be controlled by another circuit, another device, or the like instead of the control unit 20A.

Furthermore, the neuromorphic device 2 described above may be configured to include a plurality of arithmetic operation circuits 10 that are connected to each other using different connection methods in addition to the array circuit MA.

Modified Example 2 of Embodiment

Figure 9:
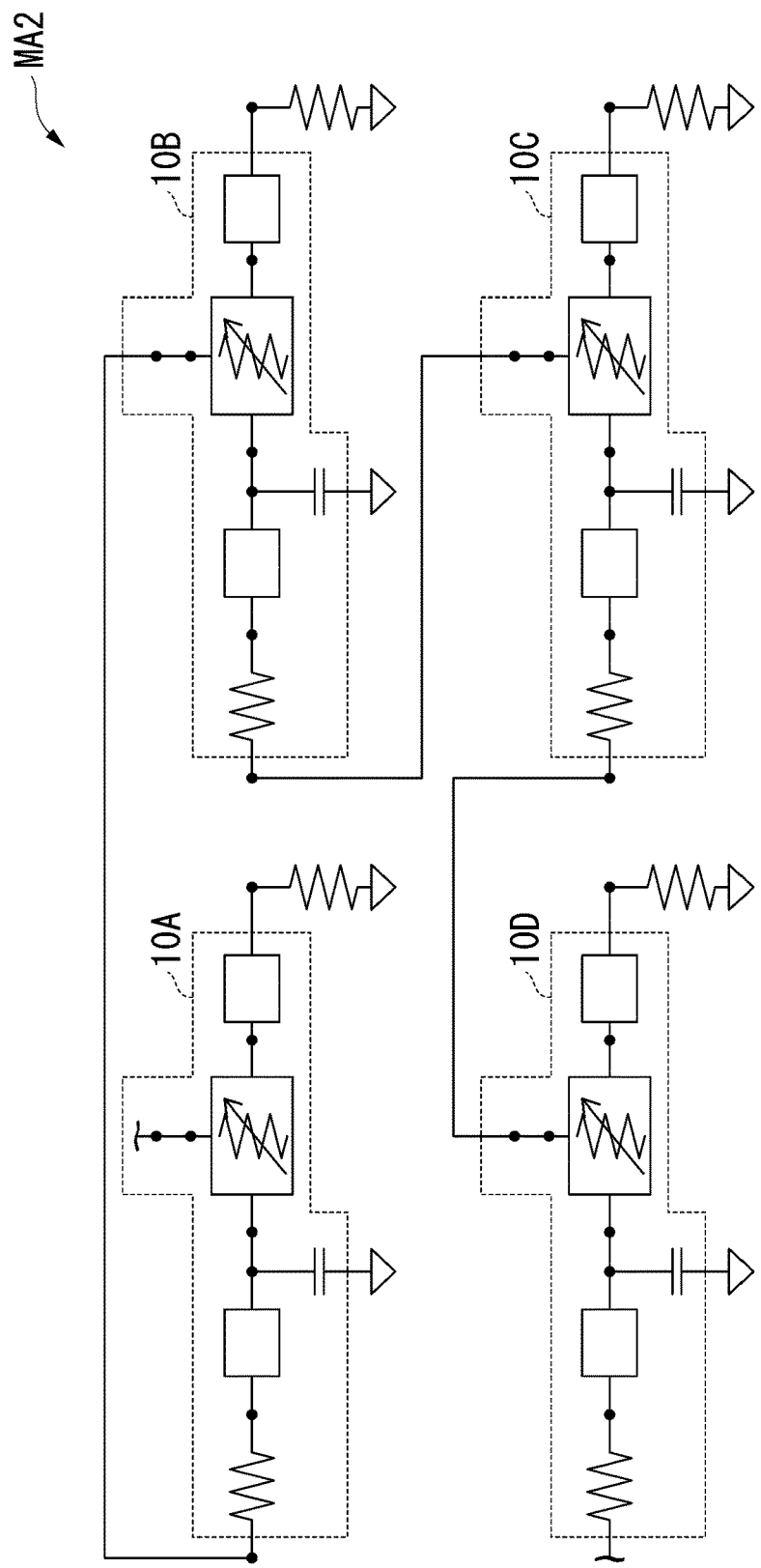
FIG. 9 is a diagram illustrating an example of a neuromorphic device 3 according to Modified Example 2 of the embodiment.

Hereinafter, Modified Example 2 of the embodiment will be described with reference to FIG. 9. In Modified Example 2 of the embodiment, the same reference signs will be assigned to components similar to those of the embodiment and the modified example of the embodiment, and description thereof will be omitted. FIG. 9 is a diagram illustrating an example of the configuration of a neuromorphic device 3 according to Modified Example 2 of the embodiment.

The neuromorphic device 3 according to Modified Example 2 of the embodiment includes an array circuit MA2 that includes a plurality of arithmetic operation circuits 10 according to the embodiment and one or more control units 20B not illustrated in the drawing. Here, the control unit 20B controls the arithmetic operation circuits 10. For example, the control unit 20B is a microcomputer. The control unit 20B may be another circuit or another device that can control the arithmetic operation circuits 10 instead of the microcomputer.

Here, in the neuromorphic device 3, each of the arithmetic operation circuits 10 may be controlled by one control unit 20B or a plurality of control units 20B. Hereinafter, as one example, a case in which each of the arithmetic operation circuits 10 is controlled by one control unit 20B will be described. In other words, in this example, the neuromorphic device 3 includes one control unit 20B. In this example, the first electrode E1 of each of the arithmetic operation circuits 10 is connected to the control unit 20B. In accordance with this, the control unit 20B can input an input signal to the first electrode E1 of each of the arithmetic operation circuits 10. In this example, in the neuromorphic device 3, the gate terminal of each of the first switching element S1 and the second switching element S2 of each of the arithmetic operation circuits 10 is connected to the control unit 20B. In accordance with this, the control unit 20B can change the state of each of the arithmetic operation circuits 10 to one of the first state to the third state. In FIG. 9, in order to prevent complications of the drawing, the control unit 20B is omitted. In addition, some or all of the plurality of the arithmetic operation circuits 10 may be controlled by another circuit, another device, or the like instead of the control unit 20B.

In the example illustrated in FIG. 9, an array circuit MA2 includes four arithmetic operation circuits 10 disposed in a matrix pattern. In FIG. 9, the four arithmetic operation circuits 10 are respectively represented as an arithmetic operation circuit 10A, an arithmetic operation circuit 10B, an arithmetic operation circuit 10C, and an arithmetic operation circuit 10D. For example, the array circuit MA2 is a part of an analog product-sum operator configured as an integrated circuit. A neuromorphic device 3 including such an analog product-sum operator (in other words, the neuromorphic device 2 including the array circuit MA2) can perform an arithmetic operation of a spiking neural network in an analog manner.

In the array circuit MA2, a second electrode E2 of the arithmetic operation circuit 10A is connected to a first electrode E1 of the arithmetic operation circuit 10B through a transmission line. In addition, in the array circuit MA2, a second electrode E2 of the arithmetic operation circuit 10B is connected to a first electrode E1 of the arithmetic operation circuit 10C through a transmission line. Furthermore, in the array circuit MA2, a second electrode E2 of the arithmetic operation circuit 10C is connected to a first electrode E1 of the arithmetic operation circuit 10D through a transmission line. In accordance with this, in the neuromorphic device 3, a spike signal output from an arithmetic operation circuit 10 corresponding to a neuron in a spiking neural network is used as an input signal of an arithmetic operation circuit 10 corresponding to another neuron. In this way, the neuromorphic device 3 can cause the spiking neural network to perform a more complicated process.

Furthermore, the neuromorphic device 3 described above may be configured to include a plurality of arithmetic operation circuits 10 that are connected to each other using different connection methods in addition to the array circuit MA2.

As above, the neuromorphic device (the neuromorphic device 3 in the example described above) includes a plurality of arithmetic operation circuits (the arithmetic operation circuits 10 in the example described above). In this way, the neuromorphic device can realize a spiking neural network using a variable resistance element of a three-terminal type.

In addition, in the neuromorphic device, a configuration in which a second electrode of a first arithmetic operation circuit included in the plurality of arithmetic operation circuits (for example, the arithmetic operation circuit 10A in the example described above) is connected to a first electrode of a second arithmetic operation circuit (for example, the arithmetic operation circuit 10B in the example described above) included in the plurality of arithmetic operation circuits may be employed.

<Method for Configuring Arithmetic Operation Circuit>

Hereinafter, a method for configuring the arithmetic operation circuit 10 described above will be described with reference to FIG. 10. Here, hereinafter, for the convenience of description, a plate-shaped member made of a semiconductor (for example, silicon) on which a transmission line, circuit elements, and the like are stacked will be referred to as a substrate in the description.

Figure 10:
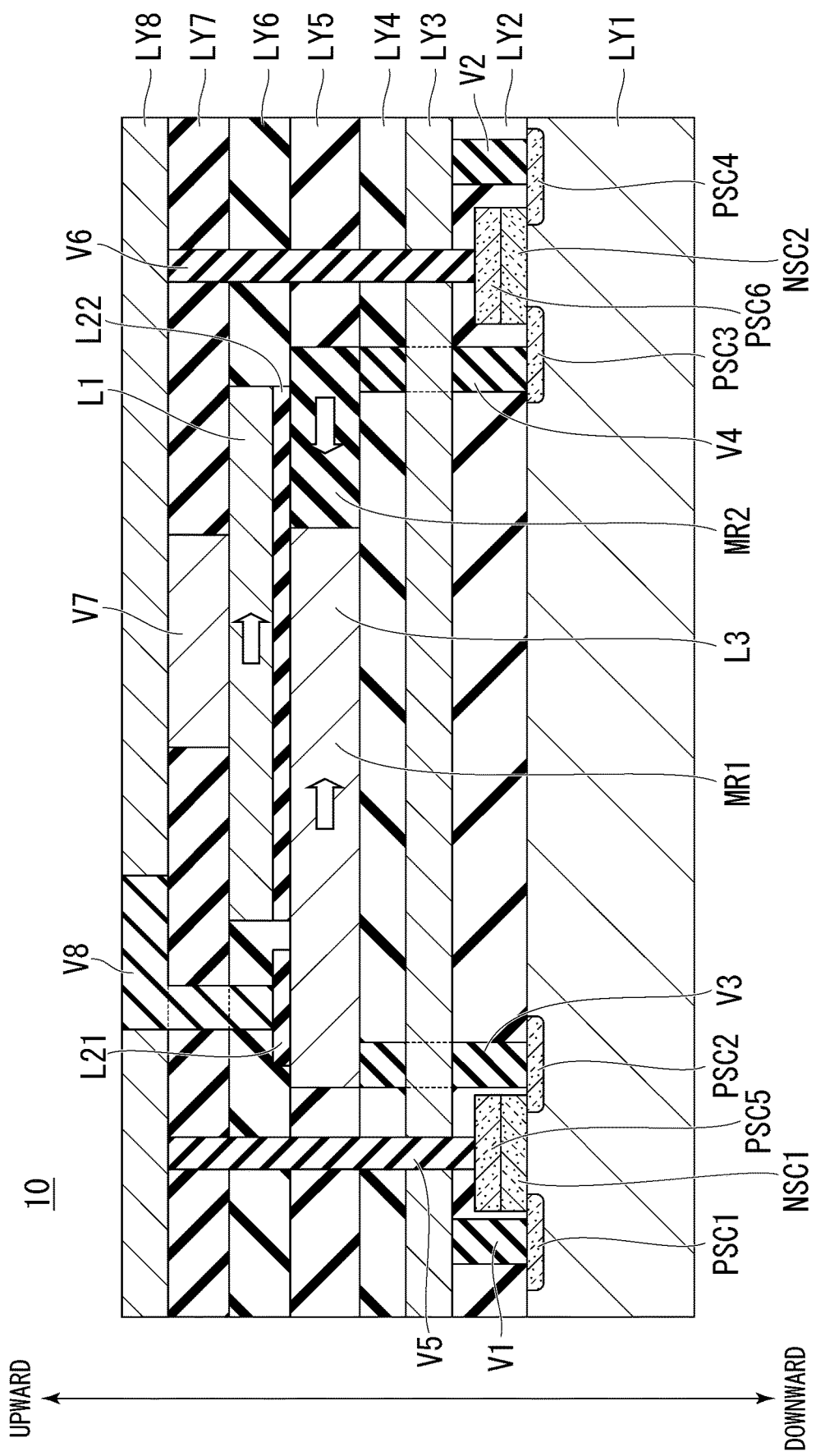
FIG. 10 is a diagram illustrating an example of an arithmetic operation circuit 10 configured on a substrate.

In the example illustrated in FIG. 10, the arithmetic operation circuit 10 is an integrated circuit in which a variable resistance element 11, a first switching element S1, a second switching element S2, and a capacitor C are stacked on a substrate. In other words, for example, the arithmetic operation circuit 10 is configured by stacking the variable resistance element 11, the first switching element S1, the second switching element S2, and the capacitor C on one (or a plurality of) substrate. FIG. 10 is a diagram illustrating an example of the arithmetic operation circuit 10 configured on the substrate. In addition, FIG. 10 is cross-sectional view illustrating an example of a cut section of the arithmetic operation circuit 10 configured on the substrate. In addition, in FIG. 10, in order to clearly represent the structure of the arithmetic operation circuit 10 stacked on the substrate, members not included in the arithmetic operation circuit 10 among members stacked on the substrate are omitted. For example, such members are various circuit elements, a transmission line, and the like stacked on the substrate.

Hereinafter, for the convenience of description, a direction from the substrate to each layer stacked on the substrate among directions that are orthogonal to the substrate will be referred to as an "upward", and a direction from each layer stacked on the substrate to the substrate among the directions that are orthogonal to the substrate will be referred to as "downward" in the description. An arrow represented in FIG. 10 represents an upward direction and a downward direction in FIG. 10.

Hereinafter, as one example, a case in which each of the first switching element S1 and the second switching element S2 is a field effect transistor of a PNP type will be described.

A layer LY1 illustrated in FIG. 10 is the substrate. In a layer LY, four P-type semiconductors PSC are embedded to be separate from each other. In FIG. 10, these four P-type semiconductors PSC are respectively represented as a semiconductor PSC1, a semiconductor PSC2, a semiconductor PSC3, and a semiconductor PSC4.

A layer LY2 illustrated in FIG. 10 is an insulating layer. The layer LY2 is stacked on the layer LY1. In addition, other layers may be configured to be included between the layer LY1 and the layer LY2. In the layer LY2, an N-type semiconductor NSC1 is embedded to be in contact with the semiconductor PSC1 and the semiconductor PSC2. In addition, in the layer LY2, an N-type semiconductor NSC2 is embedded to be in contact with the semiconductor PSC3 and the semiconductor PSC4.

Furthermore, in the layer LY2, the semiconductor PSC5 is embedded such that the P-type semiconductor PSC5 is stacked on the semiconductor NSC1. In addition, in the layer LY2, the semiconductor PSC6 is embedded such that the P-type semiconductor PSC6 is stacked on the semiconductor NSC2. The semiconductor PSC5 and the semiconductor PSC6 are embedded in the layer LY2 not to be in contact with other layers such as a layer LY3 and the like.

The layer LY3 illustrated in FIG. 10 is a wiring layer. The layer LY3 is stacked on the layer LY2. In addition, other layers may be configured to be included between the layer LY2 and the layer LY3.

A layer LY4 illustrated in FIG. 10 is an insulating layer. The layer LY4 is stacked on the layer LY3. In addition, other layers may be configured to be included between the layer LY3 and the layer LY4.

A layer LY5 illustrated in FIG. 10 is an insulating layer. The layer LY5 is stacked on the layer LY4. In addition, other layers may be configured to be included between the layer LY4 and the layer LY5.

In the layer LY5, the magnetic recording layer L3 of the variable resistance element 11 is embedded to be in contact with the layer LY4 and a layer LY6.

The layer LY6 illustrated in FIG. 10 is an insulating layer. The layer LY6 is stacked on the layer LY5. In addition, other layers may be configured to be included between the layer LY5 and the layer LY6.

In the layer LY6, two non-magnetic layers L2 are separately embedded to be in contact with the magnetic recording layer L3 embedded in the layer LY5.

In FIG. 10, these two non-magnetic layers L2 are represented as a non-magnetic layer L21 and a non-magnetic layer L22. In addition, in the layer LY6, a ferromagnetic layer L1 is embedded such that it is stacked on the non-magnetic layer L22 and is also in contact with the layer LY7.

A layer LY7 illustrated in FIG. 10 is an insulating layer. The layer LY7 is stacked on the layer LY6. In addition, other layers may be configured to be included between the layer LY6 and the layer LY7.

A layer LY8 illustrated in FIG. 10 is a wiring layer. The layer LY8 is stacked on the layer LY7. In addition, other layers may be configured to be included between the layer LY7 and the layer LY8.

In the example illustrated in FIG. 10, the semiconductor PSC1 and the layer LY3 are connected by a via V1 penetrating the layer LY2. In addition, in this example, the semiconductor PSC4 and the layer LY3 are connected by a via V2 penetrating the layer LY2.

In addition, in the example illustrated in FIG. 10, the semiconductor PSC2 and an end of a part of the magnetic recording layer L3 that corresponds to the magnetic domain MR1 described above are connected to each other by a via V3 penetrating the layer LY2 to the layer LY4. In addition, in this example, the semiconductor PSC3 and a part of the magnetic recording layer L3 that corresponds to the magnetic domain MR2 described above are connected to each other by a via V4 penetrating the layer LY2 to the layer LY4.

In the example illustrated in FIG. 10, the semiconductor PSC5 and the layer LY8 are connected by a via V5 penetrating the layer LY2 to the layer LY7. In addition, in this example, the semiconductor PSC6 and the layer LY8 are connected by a via V6 penetrating the layer LY2 to the layer LY7.

In the example illustrated in FIG. 10, the ferromagnetic layer L1 and the layer LY8 are connected by a via V7 penetrating the layer LY7. In addition, in this example, the non-magnetic layer L21 and the ground not illustrated in the drawing are connected by a via V8 penetrating the layer LY6 to the layer LY8.

In this way, in the example illustrated in FIG. 10, the arithmetic operation circuit 10 is configured such that the magnetic recording layer L3 and the ferromagnetic layer L1 connected to the magnetic recording layer L3 through the non-magnetic layer L22 are stacked on the substrate. In this example, the arithmetic operation circuit 10 includes the via V3 that functions as the second terminal TM2 at one end of both ends of the magnetic recording layer L3 and includes the via V4 that functions as the third terminal TM3 at the other end of both the ends of the magnetic recording layer L3. In this example, two non-magnetic layers disposed to be separate from each other, in other words, the non-magnetic layer L21 and the non-magnetic layer L22 are stacked on the magnetic recording layer L3. In this case, the non-magnetic layer L21 functions as the capacitor C. In other words, in this case, in the arithmetic operation circuit 10, one of two pole plates of the capacitor C is a part of the outer peripheral part of the variable resistance element 11. In accordance with this, the arithmetic operation circuit 10 can inhibit an increase of a manufacturing cost and can be easily manufactured.

In the arithmetic operation circuit 10 illustrated in FIG. 10, the non-magnetic layer L21 may be configured to be stacked below the magnetic recording layer L3. The material of the insulating layer of the arithmetic operation circuit 10 illustrated in FIG. 10 may be the same as the material of the non-magnetic layer L21 and the non-magnetic layer L22.

As above, the arithmetic operation circuit is an integrated circuit in which a variable resistance element, a first switching element, a second switching element, and a capacitor are stacked on a substrate (the layer LY1 in the example described above). In this way, the arithmetic operation circuit, for example, can decrease a neuromorphic device including a plurality of arithmetic operation circuits in size.

In addition, according to other aspect of the arithmetic operation circuit according to an embodiment including: a variable resistance element that includes three terminals that are a first terminal, a second terminal, and a third terminal and is configured to be able to change a resistance value; a first electrode connected to the first terminal; a second electrode connected to the second terminal; a third electrode connected to the terminal; and a capacitor connected between a transmission line connecting the second electrode and the second terminal and the ground.

In addition, according to other aspect of the arithmetic operation circuit according to an embodiment including: a variable resistance element that includes three terminals that are a first terminal, a second terminal, and a third terminal and is configured to be able to change a resistance value; a first electrode connected to the first terminal; a second electrode; a third electrode; a first switching element connected between the second electrode and the second terminal; and a second switching element connected between the third electrode and the third terminal, wherein parasitic capacitance of the first switching element is charged when an input signal is input to the first electrode in a case in which both states of the first switching element and the second switching element are off states, and wherein the arithmetic operation circuit is configured to output a signal corresponding to a discharge current of the capacitor from the second electrode when the state of the first switching element is changed to an on state with the state of the second switching element maintained to be the off state in a case in which both the states of the first switching element and the second switching element are the off states and in a case in which the parasitic capacitance is in a charged state.

REFERENCE SIGNS LIST 1 arithmetic operation system
2, 3 neuromorphic device
10, 10A, 10B, 10C, 10D arithmetic operation circuit
11 variable resistance element
20, 20A, 20B control unit
B1 variable resistance unit
B11, B12 magnetization fixing unit
BC three-dimensional coordinate system
C capacitor
DW magnetic domain wall
E1 first electrode
E2 second electrode
E3 third electrode
L1 ferromagnetic layer
L2 non-magnetic layer
L3 magnetic recording layer
L21, L22 non-magnetic layer
MA, MA2 array circuit
RR1, RR2 resistor
MR1, MR2 magnetic domain
S1 first switching element
S2 second switching element
TM1 first terminal
TM2 second terminal
TM3 third terminal

The invention claimed is:

1. An arithmetic operation circuit comprising:
a variable resistance element that includes three terminals that are a first terminal, a second terminal, and a third terminal and is configured to be able to change a resistance value;
a first electrode connected to the first terminal;
a second electrode;
a third electrode;
a first switching element connected between the second electrode and the second terminal;
a second switching element connected between the third electrode and the third terminal; and
a capacitor connected between a transmission line connecting the second terminal and the first switching element and the ground.

2. The arithmetic operation circuit according to claim 1, wherein the variable resistance element is a magnetoresistive effect element of a magnetic domain wall displacement type of which a resistance value changes in accordance with a current flowing between the second terminal and the third terminal.

3. The arithmetic operation circuit according to claim 1, wherein the capacitor is configured to be charged when an input signal is input to the first electrode in a case in which both states of the first switching element and the second switching element are off states.

4. The arithmetic operation circuit according to claim 1, wherein the arithmetic operation circuit is configured to output a signal corresponding to a discharge current of the capacitor from the second electrode when a state of the first switching element is changed to an on state with a state of the second switching element maintained to be an off state in a state in which no input signal is input to the first electrode in a case in which both the states of the first switching element and the second switching element are the off states and in a case in which the capacitor is in a charged state.

5. The arithmetic operation circuit according to claim 1, wherein one of two pole plates of the capacitor is a part of an outer peripheral part of the variable resistance element.

6. The arithmetic operation circuit according to claim 1, wherein the arithmetic operation circuit is an integrated circuit in which the variable resistance element, the first switching element, the second switching element, and the capacitor are stacked on a substrate.

7. A neuromorphic device comprising a plurality of the arithmetic operation circuits according to claim 1.

8. The neuromorphic device according to claim 7, wherein the second electrodes of at least some arithmetic operation circuits among the plurality of the arithmetic operation circuits are connected to each other.

9. The neuromorphic device according to claim 7, wherein the second electrodes of first arithmetic operation circuits included in the plurality of the arithmetic operation circuits are connected to the first electrodes of second arithmetic operation circuits included in the plurality of the arithmetic operation circuits.

10. The neuromorphic device according to claim 7, further comprising a control unit configured to control the first switching elements of the plurality of the arithmetic operation circuits.

11. The neuromorphic device according to claim 10, wherein the control unit controls the first switching elements of at least some arithmetic operation circuits among the plurality of the arithmetic operation circuits in synchronization with each other.

12. The neuromorphic device according to claim 10, wherein the control unit controls the first switching elements of at least some arithmetic operation circuits among the plurality of the arithmetic operation circuits without causing the first switching elements to be in synchronization with each other.

13. The neuromorphic device according to claim 12, wherein, for each of the plurality of the arithmetic operation circuits, the control unit controls the first switching element of the arithmetic operation circuit in accordance with an input signal input to the first electrode of the arithmetic operation circuit.

* * * * *